(12) United States Patent
Moore

(10) Patent No.: US 10,781,351 B1
(45) Date of Patent: Sep. 22, 2020

(54) HEXAGONAL BORON NITRIDE THERMAL CONDUCTIVITY ENHANCING MATERIALS AND METHOD OF MAKING

(71) Applicant: Louisiana Tech Research Corporation, Ruston, LA (US)

(72) Inventor: Arden L. Moore, Ruston, LA (US)

(73) Assignee: Louisiana Tech Research Corporation, Ruston, LA (US)

( * ) Notice: Subject to any disclaimer, the term of this patent is extended or adjusted under 35 U.S.C. 154(b) by 496 days.

(21) Appl. No.: 15/605,631

(22) Filed: May 25, 2017

Related U.S. Application Data

(60) Provisional application No. 62/341,387, filed on May 25, 2016.

(51) Int. Cl.
 *C08K 3/38* (2006.01)
 *C04B 35/583* (2006.01)
 *C09K 5/14* (2006.01)
 *C01B 21/064* (2006.01)

(52) U.S. Cl.
 CPC ............ *C09K 5/14* (2013.01); *C01B 21/0641* (2013.01); *C01B 21/0648* (2013.01); *C01P 2006/16* (2013.01); *C01P 2006/32* (2013.01); *C04B 35/583* (2013.01); *C08K 2003/385* (2013.01); *Y10T 428/12576* (2015.01)

(58) Field of Classification Search
 CPC .......... C04B 35/583; Y10T 428/12576; C08K 2003/385
 See application file for complete search history.

(56) References Cited

U.S. PATENT DOCUMENTS

2008/0031767 A1* 2/2008 Naumann ............... B01J 23/755
                                                                        420/457
2014/0319467 A1* 10/2014 Iannaccone ........... H01L 29/778
                                                                        257/27

FOREIGN PATENT DOCUMENTS

CN            104803362 A    *   7/2015

OTHER PUBLICATIONS

Moore, A.; Shi, Li.; "Emerging Challenges and Materials for Thermal Management of Electronics"; Materials Today, 2014, vol. 17, p. 163-173.*
Ji, H.; Sellan, D.; Pettes, M.; Kong, X.; Ji, J.; Shi, L.; Ruoff, R.; "Enhanced Thermal Conductivity of Phase Change Materials with Ultrathing-graphite Foams for Thermal Energy Storage"; Energy Environ. Sci., 2014 p. 1185-1192.*
Yin, J.; Li, X.; Zhou, J.; Guo, W.; "Ultralight Three-Dimensional Boron Nitride Foam with Ultralow Permittivity and Superelasticity"; Nano Letters, 2013, p. 3232-3236 and associated Supporting Information, p. 1-7.*

(Continued)

Primary Examiner — Mark Ruthkosky
Assistant Examiner — Julia L Rummel
(74) Attorney, Agent, or Firm — Jones Walker LLP

(57) ABSTRACT

A porous hexagonal boron nitride (h-BN) material with thermally conductive properties, includes a network of interconnected struts and nodes. The porous h-BN material is formed by depositing h-BN onto a catalyst foam using chemical vapor deposition at atmospheric pressure. The catalyst foam with the h-BN layer deposited thereon is then encapsulated with an insulating material. After the insulating material layer is cured, the h-BN structure is cut on an edge and then wet-etched to at least partially remove the catalyst foam.

14 Claims, 10 Drawing Sheets

(56) References Cited

OTHER PUBLICATIONS

Loeblein, M.; Tay, R.; Tsang, S., Ng, W.; Teo, E.; "Configurable Three-Dimensional Boron Nitride-Carbon Architecture and Its Tunable Electronic Behavior with Stable Thermal Performances"; Small Journal, 2014, 10, p. 2992-2999.*

English language translation of CN104803362A, generated with Espacenet website (https://www.epo.org/searching-for-patents/technical/espacenet.html) on May 6, 2020.*

Shi, Li, et al. "Measuring thermal and thermoelectric properties of one-dimensional nanostructures using a microfabricated device." Journal of heat transfer 125.5 (2003): 881-888.

Gorbachev, Roman V., et al. "Hunting for monolayer boron nitride: optical and Raman signatures." Nat'l Institute for Materials Science (pp. 1-5).

Aradi, Emily, et al. "Ion beam modification of the structure and properties of hexagonal boron nitride: An infrared and X-ray diffraction study." Nuclear Instruments and Methods in Physics Research Section B: Beam Interactions with Materials and Atoms 331 (2014): 140-143.

Kobayashi, Takamichi, et al. "Phase transformation of turbostratic BN by shock compression." Chemistry of materials 9.1 (1997): 233-236.

Frueh, Samuel, et al. "Pyrolytic decomposition of ammonia borane to boron nitride." Inorganic chemistry 50 (2011): 783-792.

Fazen, Paul J., et al. "Synthesis, properties, and ceramic conversion reactions of polyborazylene. A high-yield polymeric precursor to boron nitride." Chemistry of materials 7.10 (1995): 1942-1956.

Sichel, E. K., et al. "Heat capacity and thermal conductivity of hexagonal pyrolytic boron nitride." Physical review B 13.10 (1976): 4607-4613.

Cahill, David G., and Robert O. Pohl. "Thermal conductivity of amorphous solids above the plateau." Physical review B 35.8 (1987): 4067-4073.

Ashton, Taylor S. Three-dimensional Hexagonal Boron Nitride as Non-traditional Thermal Enhancement in Composite Materials. Diss. Louisiana Tech University, 2015.

Ashton, Taylor S., and Arden L. Moore. "Three-dimensional foam-like hexagonal boron nitride nanomaterials via atmospheric pressure chemical vapor deposition." Journal of materials science 50.18 (2015): 6220-6226.

\* cited by examiner

HEXAGONAL BORON NITRIDE THERMAL CONDUCTIVITY ENHANCING MATERIALS AND METHOD OF MAKING

CROSS-REFERENCE TO RELATED APPLICATIONS

This application claims the benefit of and priority to U.S. Provisional Patent Application No. 62/341,387, filed on May 25, 2016, which is fully incorporated herein by reference.

STATEMENT OF FEDERALLY SPONSORED RESEARCH OR DEVELOPMENT

This invention was made with government support under Award No. LEQSF (2010-2015), Subcontract No. 91313 awarded by the Louisiana Space Consortium. The government has certain rights in this invention.

BACKGROUND

Hexagonal boron nitride (h-BN) is a non-toxic, lightweight ceramic material stable to approximately 800-1000° C. in air and approximately 2700-3000° C. in inert atmospheres. h-BN possesses hexagonally arranged B—N bonds in a layered atomic lattice and has high in-plane thermal conductivity, with bulk values of 350 $W*m^{-1}K^{-1}$ at 300 K and 140 $W*m^{-1}K^{-1}$ at 800 K. H—BN also possesses a wide bandgap (about 4-6 eV) and is chemically inert.

Currently, the most common commercial process for the manufacture and use of h-BN is by fabricating microparticles to be hot pressed, sintered, or used as a composite filler to form shapes rather than stand-alone contiguous pieces. Hot pressed h-BN typically possess thermal conductivity, κ, in the range of 20-60 $W*m^{-1}K^{-1}$, while composites have reached as high as 32.5 $W*m^{-1}K^{-1}$ at an 88% weight fraction. While higher loading can lead to higher effective thermal conductivity of composites, very high loading fractions can greatly reduce the mechanical properties of these parts. Additionally, while bulk h-BN has a high in-plane thermal conductivity, particle-particle interfacial thermal resistance (ITR) is a concern when creating composite structures incorporating h-BN particulate. Random orientation of particulate within a composite can also limit the overall thermal conductance due to h-BN's anisotropic thermal conductivity.

Low pressure CVD (LPCVD) processes have also been used to create h-BN composites. LPCVD processes require additional equipment, process control, and safety considerations related to the pumping of the gases required for growth and transportation of the vaporous precursor material.

DESCRIPTION OF SELECTED EMBODIMENTS

A porous hexagonal boron nitride (h-BN) material that is thermally conductive and a method of making the porous h-BN material using chemical vapor deposition at atmospheric pressure (APCVD) is disclosed herein. While h-BN has previously been deposited on structures using a low pressure chemical vapor deposition (LPCVD) or through fabrication using micro-particles that are pressed into a composite, the h-BN deposited on the catalyst foam material using the APCVD process exhibits superior qualities to the h-BN deposited using the LPCVD or the micro-particle pressing process, as is discussed below.

Figure 2:
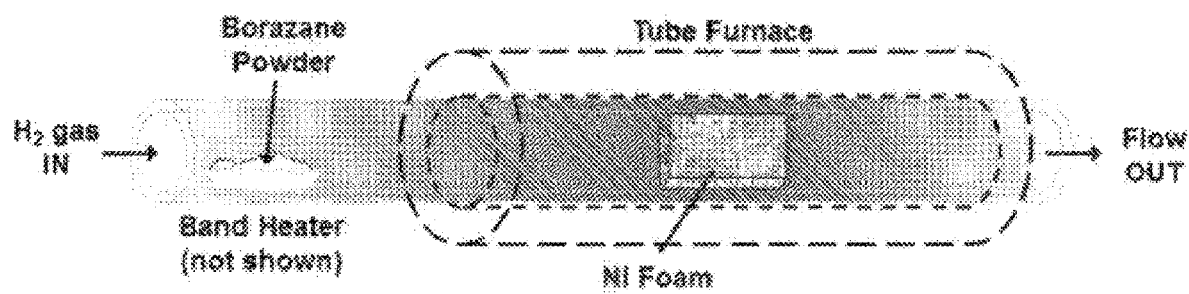
FIG. 2 is an illustration of one embodiment of an atmospheric pressure chemical vapor deposition furnace for depositing hexagonal boron nitride on a catalyst foam.

Referring to FIG. 2, the APCVD method includes positioning a catalyst foam material in a furnace, heating the furnace to at least about 700° C., and flowing a boron and nitrogen containing gas across the catalyst foam material at near atmospheric pressure (between about 60 and 140 kPa or any subrange there between) while maintaining the furnace temperature between about 700° C. and 1400° C. or any subrange there between. For example, in one embodiment the furnace is heated to at least about 900° C. and the pressure is between about 80 and 120 kPa.

The flow of the boron and nitrogen containing gas is continued until the h-BN layer is the desired thickness. The catalyst foam material with the h-BN layer deposited thereon is then allowed to cool. This process may be repeated until the desired number of h-BN layers is deposited on the catalyst foam material. A single layer may be about 35 nm thick. In some embodiments, the flow of boron and nitrogen containing gas across the catalyst foam material in the furnace, with the temperature maintained above about 900° C., is continued until a layer of h-BN at least 50 nm thick is deposited on the catalyst foam material. The total thickness of all h-BN layers may range between about 35 nm to 750 nm and any subrange there between. Alternatively, the catalyst foam material may have a single layer of h-BN deposited thereon.

After cooling, a layer of insulating material (such as PMMA/chlorobenzene) is added to the h-BN layer throughout the pore structure. The layer of insulating material "encapsulates" the h-BN layer. The h-BN structure may be encapsulated with an electrically insulating material such that the insulating material fills at least 50% of the pores in the h-BN structure. Alternately, the insulating material may fill at least about 90% of the pores in the h-BN structure. The term "encapsualte," as used herein, includes both complete and incomplete encapsulations and does not require the entire volume of h-BN material to have insulation in all of its pore spaces. In an incomplete encapsulation, a small portion of h-BN may remain uncoated with the insulating material.

In many examples, after the h-BN layer is encapsulated with the insulating material, the insulating material is cured. The time, temperature, and method of curing can vary depending on the insulating material used and the desired thickness of the insulating material. For example, in embodiments where the h-BN layer is dip-coated in PMMA/chlorobenzene, the curing step may be performed at 150° C. for approximately 45 minutes. However, if a more viscous (12% wt) PMMA/chlorobenzene is used, the curing step may be performed at 100° C. for approximately 90 minutes. Additionally, as part of the curing step, the structure may optionally be flipped (for example, approximately every 10 minutes). Additionally, in some embodiments, after the curing step is completed, additional insulating material may be added, for example by drop-cast technique, and allowed to dry to attempt to eliminate any voids that may be present (areas where the h-BN was not completely coated by the initial application of the insulating material). For example, a lighter 4.5% PMMA/chlorobenzene may be drop-cast on the h-BN structure to fill any voids. In one embodiment, the insulating material fills at least any percentage between about 30% and 99% of the pore space of the h-BN structure.

Once the curing process is complete, the catalyst foam structure coated with h-BN and insulating material is cut on an edge to expose the catalyst foam material. The structure is then wet-etched to remove at least a majority the catalyst foam material while leaving the h-BN encapsulated with the insulating material; this results in lattice-like, interconnected, porous h-BN structure, coated with an insulating material and having hollow struts. The wet etching can be done using an acid, such as HCl. The time for the wet-etching step is determined by the size of the h-BN structure. For example, the h-BN structure may be wet-etched with 6M HCl at about 100° C. for approximately 2 hours. For larger h-BN structure sizes, the h-BN structure may be wet-etched with 6M HCl at about 100° C. for approximately 6-8 hours. In other embodiments, less harsh etching chemicals, such as ferric nitrate ($Fe(NO_3)_3$) or ammonium persulfate (($NH_4$)$_2S_2O_8$), may be used. In some embodiments, the h-BN/insulating material composite structure is substantially free of the underlying catalyst foam material after the wet-etching process. For example, after wet-etching, the h-BN/insulating material composite structure may be, alternatively, at least about 80%, 90%, or 95% free of the underlying catalyst foam material.

In some embodiments, the method includes removal or partial removal of the insulating material. For example, if PMMA/chlorobenzene is used as the insulating material, the method can include the step of burning off the PMMA by heating the h-BN structure to about 450° C. for approximately 90 minutes.

In certain embodiments, the catalyst foam material is selected from: nickel, copper, platinum, or an alloy of any of the foregoing. In one embodiment, the catalyst foam is formed of an alloy that is at least about 90% nickel, copper, or platinum. However, in other embodiments, the catalyst foam could potentially be a metal other than nickel, copper, or platinum. In one embodiment, the catalyst foam material has a pore size ranging from about 10 to about 10,000 microns, or any subrange there between. Alternatively, the catalyst foam material has pore sizes ranging from about 100 to about 1000 microns. The catalyst foam material may have a uniform pore size. Alternatively, the catalyst foam material may have varying pore sizes within the range of about 100 to about 1000 microns or any subrange there between.

The catalyst foam material may be annealed prior to the addition of the boron and nitrogen containing gas being introduced. The catalyst foam may be annealed at temperatures ranging from about 300° C. to about 700° C. for about 30 minutes to about 48 hours. This annealing step removes oxides from the catalyst foam material. However, in other embodiments, the catalyst foam is not annealed prior to the boron and nitrogen gas being introduced.

The boron and nitrogen containing gas used is any gas that includes at least boron and nitrogen (but can include other elements as well) and can include those elements at various ratios. For example, the gas can have a ratio of boron to nitrogen of between about 0.75:1 to about 1.25:1. Alternatively, the gas can have a ratio of boron to nitrogen of between about 1:0.75 to about 1:1.25. In one embodiment, the boron containing gas is generated by sublimating a boron containing powder in a gas flow that is directed over the catalyst foam material. In another embodiment, the boron containing powder is a boron-nitrogen-hydrogen species. A non-limiting example of a boron-nitrogen-hydrogen species is $H_3B$—$NH_3$. However, any powder capable of supplying boron and nitrogen may be sublimated to yield a boron and nitrogen containing gas.

The insulating materials used in this method to encapsulate the h-BN layer can be any material that can reduce thermal and/or electrical conductivity. In one embodiment, the insulating material may have a band gap greater than approximately 7 eV, while in another embodiment, the insulating material may have a band gap of approximately 9 eV or higher. In certain embodiments, the insulating materials may have comparatively low thermal conductivities, for example lower than approximately 1 $W*m^{-1}K^{-1}$. In other embodiments, the insulating materials have thermal conductivities greater than 1 $W*m^{-1}K^{-1}$. Non-limiting examples of insulating materials includes: thermoset materials (including, but not limited to polyurethanes, acrylics, and epoxies), silicones (including, but not limited to polydimethylsiloxane and silicone resins), and waxes (including but not limited to paraffins and alkanes). These insulating materials may be applied to the catalyst foam material with at least one layer of h-BN deposited thereon by processes such as dip-coating, vacuum infiltration, sol-gel processes, or gravity methods.

In certain examples, the h-BN coated with insulating material may be considered a thermally conductive, electrically insulating composite material. Embodiments of this composite material may have an overall thermal conductivity greater than or less than about 1 $W*m^{-1}K^{-1}$. As used herein, "overall thermal conductivity" means the thermal conductivity of the composite material as a whole. In a similar manner, the composite material may further include an overall electrical conductivity represented by a band gap of at least about 7 eV. In one embodiment, the porous h-BN structure formed through this method consists essentially of h-BN. In another embodiment, the h-BN layer formed on the catalyst foam material has less than about 1% impurities.

In some embodiments, the catalyst foam material is formed to the desired shape of the final h-BN structure prior to depositing the h-BN to the catalyst foam material. For example, if this material is to be applied to an electronic component of specific shape and size, the parent metallic foam catalyst can be cut, bent, or shaped to conform to the component prior to APCVD. In other embodiments, the catalyst foam material coated with h-BN may be shaped prior to being coated with an insulating material. Alternatively, the combined h-BN/insulating material structure can be shaped after the h-BN is encapsulated with the insulating material.

In one embodiment, a h-BN structure that is thermally conductive and electrically insulating is formed using the above described APCVD method. The h-BN structure forms a network of struts 10 and nodes 12 (see FIGS. 1(a) and 1(b)) based on the catalyst foam that was used as a precursor material. This h-BN structure has a pore size ranging from about 100 to about 1000 microns. Further, and as discussed above, the h-BN structure may be encapsulated with an electrically insulating material such that the insulating material fills at least 50% of the pores in the h-BN structure. Alternately, the insulating material may fill at least about 90% of the pores in the h-BN structure. The h-BN structure may consist essentially of h-BN. Alternatively, the h-BN may have less than about 1% impurities. In one embodiment, the h-BN structure consists essentially of $BC_6N$. In other embodiments, the $BC_6N$ has less than about 1% impurities. The formed h-BN structure may either include the catalyst foam with the h-BN layer deposited thereon, or the catalyst foam may be substantially removed from the h-BN structure. In one embodiment, the formed h-BN structure has struts and nodes that are at least about 100 nm in h-BN thickness. If the catalyst foam has been removed, then the struts and nodes are substantially hollow.

The APCVD method for creating foam-like h-BN materials (including, but not limited to, nanomaterials) produces a ultralight, hierarchical h-BN material that is superior to the h-BN materials produced using currently known processes. As will be discussed below, experiments demonstrated that these foam-like h-BN nanomaterials are an effective ceramic composite filler The APCVD method produced h-BN composites with strut wall thicknesses that are an order of magnitude thicker than those reported using LPCVD for similar growth conditions. Additionally, the use of an open-cell foam as the catalyst also allows the h-BN to be deposited in a contiguous, interface-free foam-like manner resulting in materials (whether nanomaterials or otherwise) with a hierarchical structure. The inherently interconnected and isotropic nature of this new class of h-BN may make it exempt from the performance-limiting particle-particle interfacial thermal resistance (ITR) and orientation limitations faced by particulate-based h-BN composites.

The effective thermal conductivity of h-BN foam/PMMA composite samples was determined via a steady state method between 140 K and 330 K. Results showed a peak enhancement of 557.7% at low temperature compared to neat PMMA, corresponding to the increase of thermal conductivity of h-BN with decreasing temperature. A threefold improvement in thermal conductivity near room temperature compared to as-grown samples was observed for two samples following prolonged annealing at 700° C. in air prior to PMMA introduction. Compared with particulate-based BN composites, the h-BN samples produced by APCVD show comparable or superior performance at much lower low weight fractions (approximately 0.2-0.3%) of solid h-BN which supports the concept of reduced or eliminated ITR influence with foam-like architectures. Therefore, the inventive APCVD method for creating a porous h-BN material presented here is a simple, scalable means of realizing ultralight, three-dimensional h-BN nanomaterials that boast superior specific thermal properties. This as well as tunable thermomechanical properties could be accomplished while removing the need for expensive and complicated equipment such as turbo pumps, cold traps, or multiple process lines, which is required when using a LPCVD process. The thermomechanical properties can be tuned by adjusting the pore size of the h-BN or the layer thickness of the h-BN or the insulating material to make the h-BN structure more thermally conductive, less thermally conductive, mechanically stronger, or mechanically weaker.

EXPERIMENTS AND RESULTS

Chemical Vapor Deposition at Atmospheric Pressure.

An illustration of the APCVD growth setup used in this work is shown in FIG. 2. A three-dimensional h-BN nanomaterial structure was formed via an APCVD bottom-up synthesis method. A section of open cell nickel foam (MTI Corp.) was cut to the desired size and centered vertically in a single-zone tube furnace (Lindberg/Blue M Mini-Mite). The open cell nickel foam acted as a catalytic template for the APCVD deposition of h-BN atomic layers. By sizing the foam substrate to match the inner diameter of the quartz tube (1 m length, 20 mm ID, 25.4 mm OD), the nickel foam sample was allowed to freely stand vertically in the furnace tube without need of a secondary support, thereby resulting in overall growth uniformity. Sample pieces ranged from 10×20×1.6 mm to 20×20×1.6 mm in size. 500 mg of borane-ammonia complex (borazane, $H_3N$—$BH_3$) powder (Sigma-Aldrich—melting point: 97.61° C., decomposition temperature 68° C. via vendor) was loaded in a quartz boat, served as precursor material, and was subsequently placed upstream of the tube furnace heating zone. The nickel foam substrate was first annealed for 2 hours under 160 sccm flow of pure $H_2$ (99.999% via Airgas), before initializing h-BN growth, to remove surface oxide and improve grain size. During this annealing phase as well as the h-BN deposition, the process conditions were kept a fraction above atmospheric pressure (approximately 7 kPa gauge pressure) and 1000° C. growth temperature. Upon completion of the annealing step, the hydrogen flow rate was increased to 360 sccm and the borazane powder was then sublimated to vapor by heating to approximately 100-120° C. via two band heaters. The temperature of the precursor region was monitored by two Type K thermocouples mounted on the exterior of the quartz tube, underneath the band heaters. A growth period of 1 hour was completed, and then the tube furnace was shut off and allowed to cool naturally, while the h-BN/nickel sample was kept under inert $H_2$ flow. Following deposition of h-BN layers, the bright gray nickel foam was observed to have become dark brown in appearance.

Freestanding Sample Formation.

Following APCVD growth, post processing was necessary to remove the sacrificial nickel foam and achieve a freestanding h-BN foam by selectively etching away the nickel template. The sample was first dip-coated in a 4.5 wt. % PMMA/chlorobenzene solution to achieve a thin, structurally protective layer and then cured at 150° C. on a hot plate for approximately 45 minutes. Without this layer, the samples would collapse from fluid capillary forces during wet etching of the nickel substrate. The samples were then cut on an edge to expose the parent nickel and then selectively wet etched in 6M HCl on a hot plate at 100° C. for approximately 2 hours until the nickel was completely removed, at which point samples were observed to look white in appearance. The PMMA-coated h-BN was then carefully rinsed in deionized water, patted dry with lint-free wipes, and allowed to dry overnight before being placed in a quartz tube furnace to burn off the protective PMMA in air. The burn off process was initially performed at 700° C. for 1 hour. However, upon completion of the burn off at this temperature significant curling at the edges of the sample was observed, thereby reducing the structural stability. Therefore, the burn off process was altered to use a less aggressive temperature of 450° C., while increasing the duration to 90 minutes in order to ensure removal of the PMMA. The samples which underwent the burn off process at 450° C. retained their original geometry and did not show the deformation observed at 700° C. for previous samples.

H—BN Foam/PMMA Composite Formation.

For composite samples fully encased in PMMA (as opposed to the samples described above where PMMA was removed), an alternative post-processing method was used. Following APCVD, a more viscous 12 wt % PMMA/chlorobenzene solution was used for encapsulating and samples were fully submerged and cured at approximately 100° C. for approximately 90 minutes or until hardened. To ensure removal of air voids within the PMMA layer of the PMMA/h-BN composites, the samples were flipped every 10 minutes while curing until approximately 1 hour or until the solution became too thick to manipulate the samples. If defects were still present after the final heat cure step, lighter 4.5 wt % PMMA/chlorobenzene solution was drop-cast onto the sample and allowed to dry to fill any existing voids. The same wet etching process described above (6M; 100° C.) that was used for the freestanding samples was performed; however, the etching times were increased to approximately 6-8 hours, depending on the sample's macroscopic size (i.e. 10×20 mm$^2$ vs 15×20 mm$^2$).

Post-Growth Annealing.

The effect of post-growth annealing on sample quality and thermal transport was investigated. As-grown samples still on the parent nickel foam were placed in an annealing furnace at 700° C. for two different annealing time frames of 24 and 48 hours, respectively. After annealing was complete, samples were treated as described above to yield either freestanding, or PMMA encapsulated samples.

Steady-State Method for Measuring Thermal Conductivity.

Figure 3:
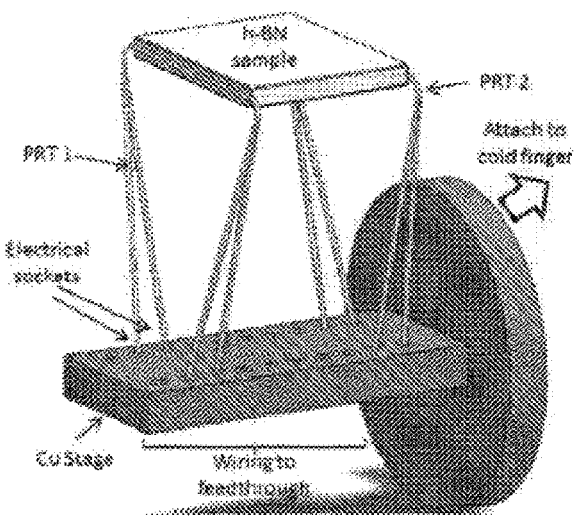
FIG. 3 is a diagram of the method used to measure sample thermal conductivity.

In order to measure samples' thermal conductivity, a steady-state method using Joule heating and platinum resistance thermometers (PRTs) was used within the controlled environment of a vacuum-pumped continuous-flow cryostat (Janis Research Company). A conceptual illustration of the sample and PRT arrangement can be seen in FIG. 3. Each of the four-probe PRTs were created from 99.999% platinum wire (diameter=0.4 mm) with a four-legged trapeze design to suspend the sample above the stage and prevent parasitic conduction. In order to mount a sample, individual legs from the two PRTs were first placed into the sample stage electrical sockets. The h-BN foam/PMMA composite (approximately 14×18×1.7 mm) was carefully placed onto the horizontal edges of the PRTs and bonded by a highly conductive silver paint (SPI), which served as a thermal and mechanical bond between the sample and the PRTS. From the socket, wiring was then connected to measurement instrumentation via a high vacuum feedthrough which was in turn connected to data acquisition hardware run by LabVIEW on a nearby computer.

After sample placement, radiation shielding was put into place and the cryostat was pumped approximately 10$^{-6}$ torr via turbo pump and mechanical backing pump. The radiation shielding and high vacuum environment help ensure that conduction along the suspended sample and down the platinum wires are the only significant heat transfer paths present during measurement. A cartridge heater integrated into the cryostat cold finger, PID temperature controller (Lakeshore), and liquid nitrogen were used to stabilize stage temperature at each data point to within 0.01 K, with the stage temperature measured using a high precision silicon diode.

Once the setup's temperature was stable at the desired data point, a high precision constant current supply was used to induce Joule heating in one PRT and create a temperature gradient along the sample's length. The remaining two legs on the heating PRT served as probes for measuring voltage drop across the four-probe PRT region via a voltage preamplifier (Stanford Research Systems). This voltage drop, when coupled with the known applied current, allowed for the electrical resistance of the heating PRT to be determined. By knowing the change in electrical resistance with temperature via calibration against the silicon diode, the measured changes in electrical resistance were subsequently used to obtain the changes in average temperature for the four-probe region of the heating PRT. On the other side of the sample, an AC voltage was applied via a lock-in amplifier (Stanford Research Systems) to measure resistance changes within the sensing PRT. The signal was intentionally limited to be at least 100× smaller than the DC current applied to the heating PRT so as not to create any significant temperature rise on its own. Similar to the heating PRT, the electrical resistance of the sensing PRT was measured and calibrated against the silicon diode temperature sensor in the cryostat.

Figure 4:
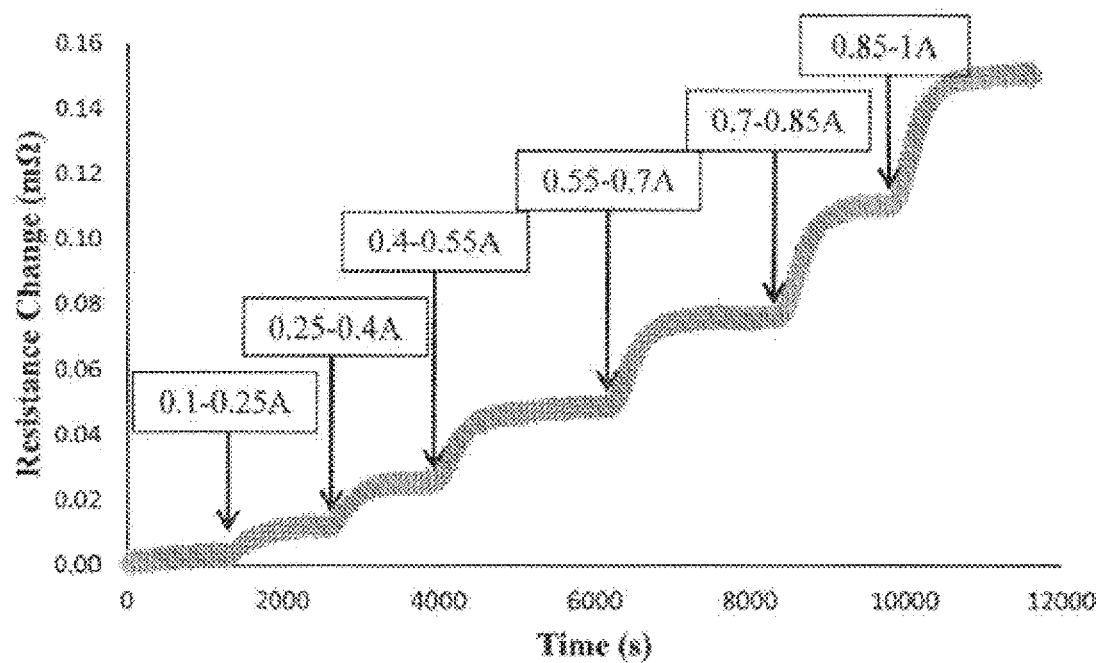
FIG. 4 is the steady-state data points at varying heating levels from Sample 2—a h-BN/PMMA composite.

During measurement, several incremental increases in current were used to induce a temperature rise across one side of the sample. At each constant current level, the continuously-monitored electrical resistance on the sensing PRT was monitored to determine when the sample's thermal condition reached reach steady state. Steady resistance values within the noise level of the lock-in amplifier for at least 10-15 minutes were deemed to indicate this steady state condition at each step, after which the current was increased to the next increment. In this way, multiple steady-state data points at varying heating levels were obtained from which the thermal resistance of the sample could be determined more accurately. To visualize this, representative data from Sample 2 at 320K is plotted in FIG. 4.

Figure 5:
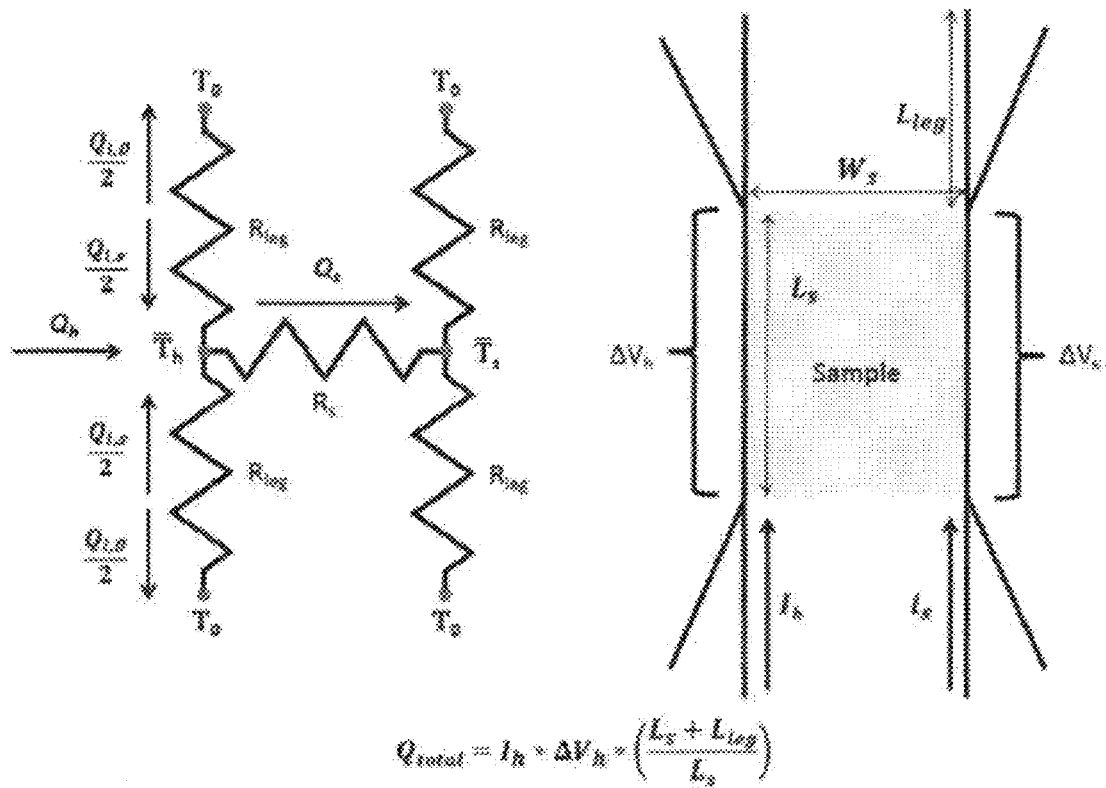
FIG. 5 is a diagram of a thermal circuit for the method of FIG. 3.

Analysis of the obtained raw data was performed in two ways. The first involved an analytical model of the measurement's thermal circuit (FIG. 5). To analyze this measurement, a modified method of Shi et al.'s analysis for measuring conduction through ID nanostructures was used. Shi L, Li D, Yu C. et al. (2003) "Measuring Thermal and Thermoelectric Properties of One-Dimensional Nanostructures Using a Microfabricated Device." *J. Heat Transfer* 125:881. doi: 10.1115/1.1597619. Briefly, for this analytical treatment the heat generated by Joule heating in the four-probe region is $Q_h = I_h * \Delta V_h$ where $I_h$ is the applied current and $\Delta V_h$ is the voltage drop within the four-probe region measured using the preamplifier. Heat is also generated in the two leads of the heater PRT, with half of the heat dissipated to the stage while the other half is conducted towards the sample; the former is $Q_{l,0}$ and the latter is $Q_{l,s}$. Therefore, the total heat from the Joule heating gives the following, $$Q_{total} = Q_{l,0} + Q_{l,s} + Q_h = Q_{l,0} + Q_s, \qquad \text{Eq. 2-1}$$

where $Q_s$ is the total heat that moves through the suspended sample. Referring to the thermal circuit in FIG. 5, the heat across the sample is, $$Q_s = G_{leg}*(\bar{T}_s - T_0) = G_s*(\bar{T}_h - \bar{T}_s). \qquad \text{Eq. 2-2}$$

Here, $\bar{T}_h$ and $\bar{T}_s$ are the average temperatures of the four-probe regions of the heating and sensing PRTs, respectively, which is what is measured using the setup described above, while $G_{leg}$ and $G_s$ are the inverse values of $R_{leg}$ and $R_s$, representing conductance of the leg(s) and sample, respectively. For the thermal circuit shown in FIG. 5 and its associated analytical treatment to be valid, the temperatures along these two regions should be uniform. A relationship with only the leg resistance and total heat, $Q_{total}$, can then be found and the resistance can then be converted to conductance by taking the inverse of the value. The difference between the average temperature on the heater and sensing sides with respect to the environment are denoted as $\Delta T_h$ and $\Delta T_s$ respectively yielding, $$G_{leg} = \frac{Q_{total}}{\Delta T_h + \Delta T_s} \qquad \text{Eq. 2-3}$$

Rearranging Eq. 2-1 to find $Q_s$, plugging in Eq. 2-2 for $Q_s$, rearranging Eq. 2-3 for $Q_{total}$, and substituting $Q_{l,0} = G_{leg}*\Delta T_h$ for the heat dissipated down the legs gives a relationship between the sample conductance and the leg conductance that yields the following equation, $$G_s = G_{leg} * \frac{\Delta T_s}{\Delta T_h - \Delta T_s}. \qquad \text{Eq. 2-4}$$

Still referring to FIG. 5, two measurements are taken, the voltage drops across the sample on the heating and sensing sides. Both voltages are converted to resistances using known current values, and those resistances can be converted to temperatures using a change in resistance relationship, $$\frac{dR_{s/h}}{dT}.$$

Since platinum's change in resistance with respect to temperature is linear, $$\frac{dR_{s/h}}{dT}$$

can be found from baseline resistances found at each temperature set point. Using $$\frac{dR_{s/h}}{dT},$$

$\Delta T_h$ and $\Delta T_s$ can be calculated at each current step. From the sample conductance, the thermal conductivity, $\kappa$, can be found by, $$\kappa_s = \frac{G_s * L_s}{A_{c,s}}.$$

As stated above, the analytical treatment is only valid when the average temperature rise at the heater and sensor four-probe regions are constant. Here, finite element analysis (FEA) was used with the experimental heating and average temperature rise data to determine the validity of this condition as it relates to the macroscopic setup shown in FIG. 3.

Characterization of Freestanding h-BN Foam Samples.

Figure 6:
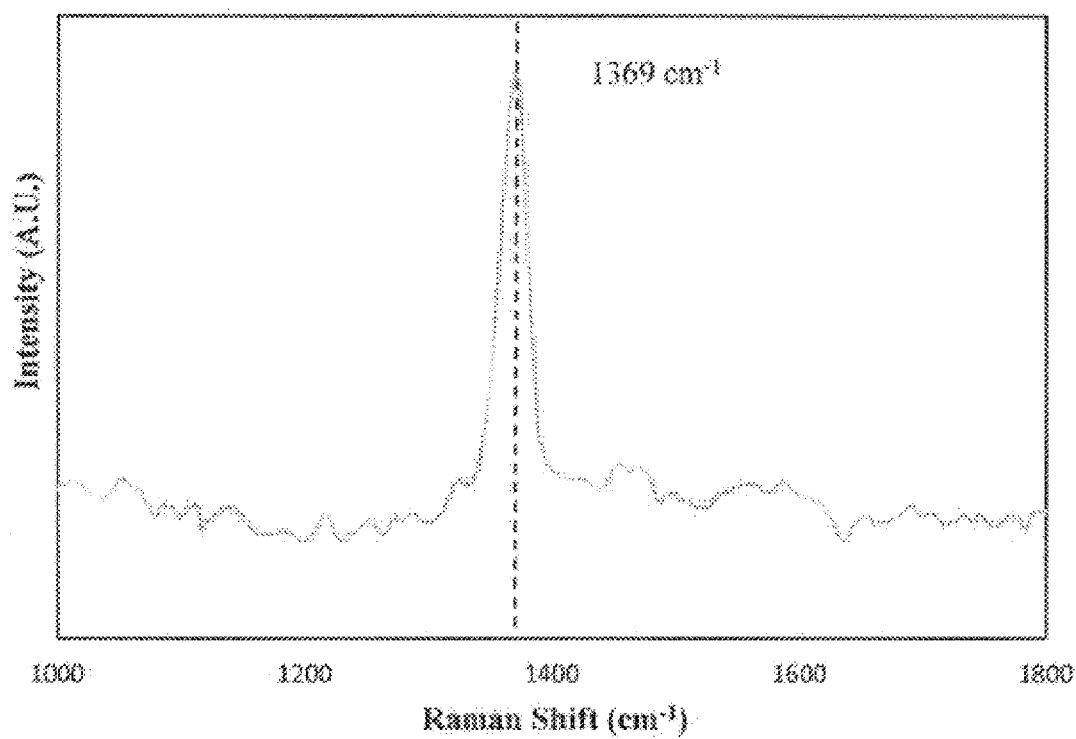
FIG. 6 is the Raman spectrum from freestanding h-BN foam after nickel etching and PMMA burn off.
Figure 7:
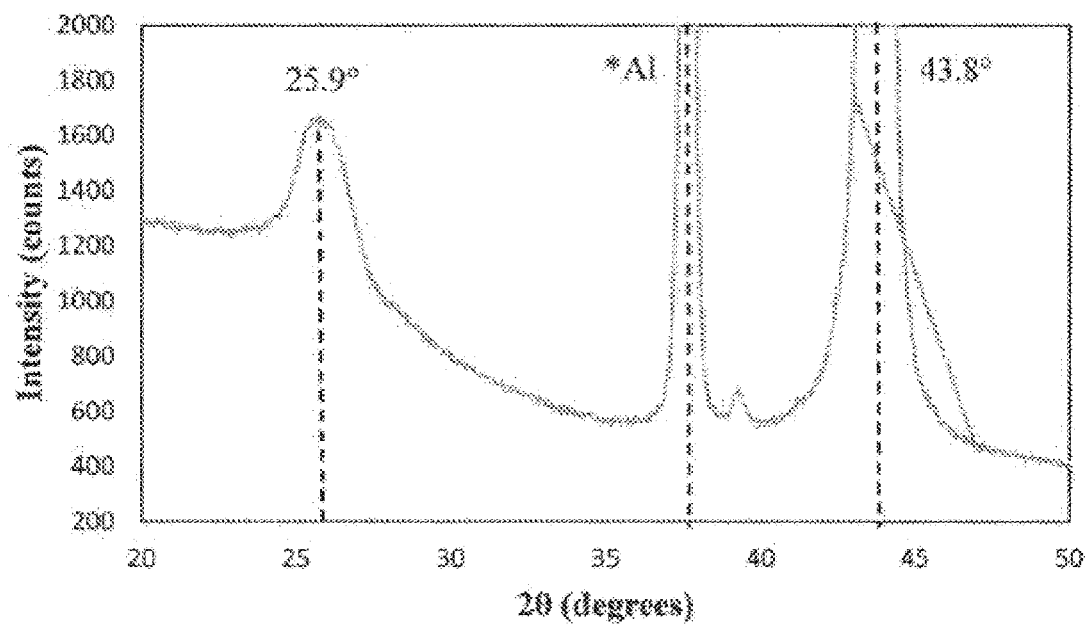
FIG. 7 is the XRD diffraction pattern of the freestanding h-BN sample.

The freestanding h-BN foam structure was characterized using confocal Raman microscopy (Horiba XploRa Plus) with a 532 nm wavelength and 10× objective at several random locations within the sample. Representative Raman spectral data can be viewed in FIG. 6. No additional peaks were observed in the spectral range taken. X-ray diffraction (XRD) analysis (Bruker D8 Discover) was conducted to further classify samples' crystal structure characteristics, such as atomic lattice distance between layers, with a representative diffraction pattern shown in FIG. 7. Peaks observed at higher 2θ values than those plotted were found to be resulting solely from the aluminum sample holder.

Figures 1A, 1B:
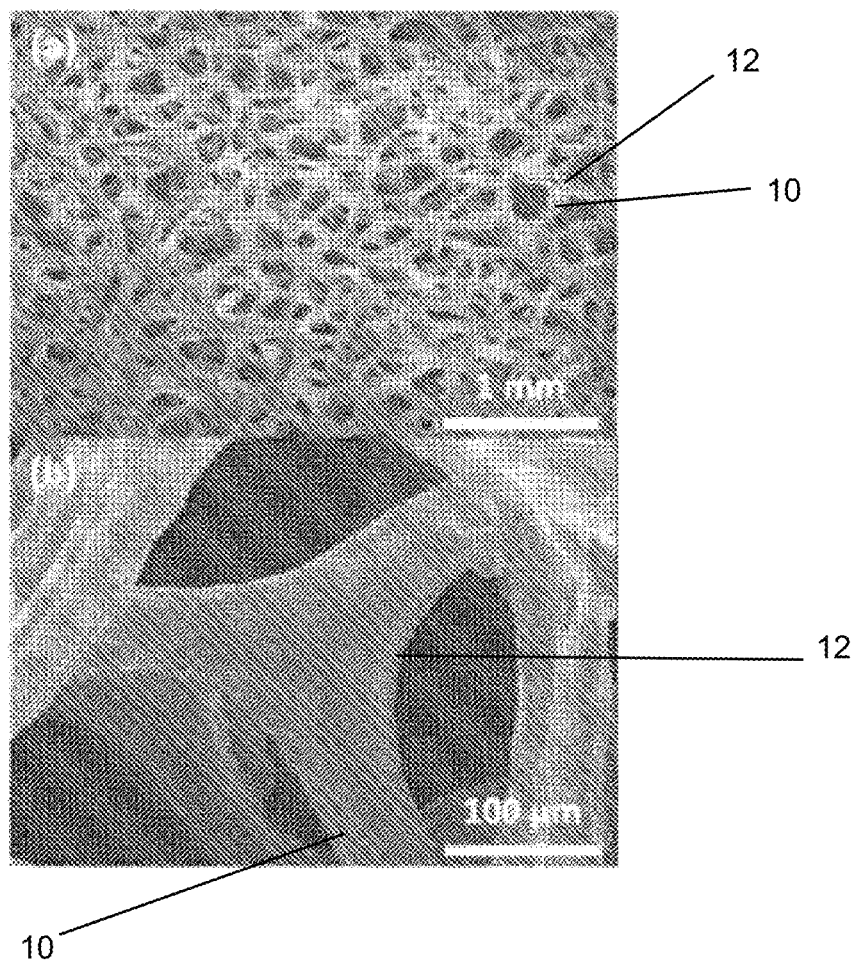
FIG. 1(a) is a FE-SEM image of a large area view of a three-dimensional foam-like h-BN sample.
FIG. 1(b) is a FE-SEM image showing the branches and nodes of a three-dimensional foam-like h-BN sample.
Figure 8:
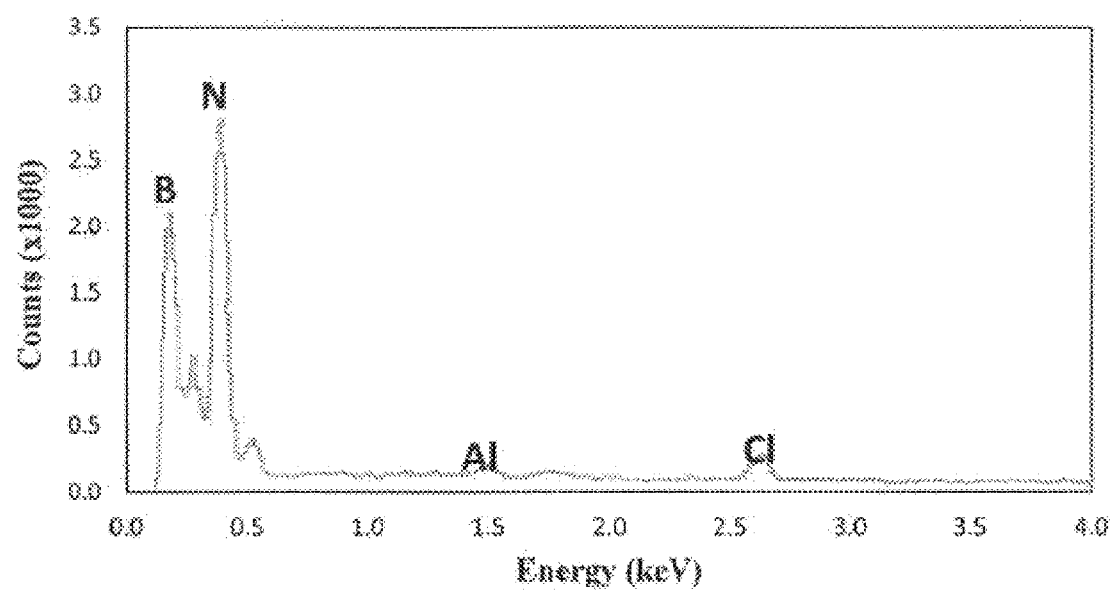
FIG. 8 is the EDS data showing the element composition of the freestanding h-BN sample (h-BN without the catalyst foam or any insulating material).

The internal structure of the samples was also observed using field-emission scanning electron microscopy (FE-SEM, Hitachi S-4800) as shown in FIGS. 1(a) and 1(b). The resulting h-BN material retains the strut structure of its parent sacrificial nickel foam template, but with hollow rather than solid branch struts, due to the selective etching of the nickel template. Within the same microscope, electron dispersive spectroscopy (EDS) was then conducted in order to determine elemental composition. Representative data is given in FIG. 8 with the accuracy of the composition quantification estimated to be ±5-10% due to the similarly light atomic masses of elemental boron and nitrogen.

The obtained Raman spectra from multiple samples yielded a consistent peak at 1369 $cm^{-1}$, matching other spectra found in the literature for high-quality crystalline h-BN. See, Gorbachev R V, Riaz I, Nair R R, et al. (2011) "Hunting for Monolayer Boron Nitride: Optical and Raman Signatures." *Small* 7:465-468. doi: 10.1002/smll.201001628. The absence of other peaks associated with defects or foreign materials is also indicative of high quality h-BN being the sole material resulting from the growth. Moreover, crystal structure analysis via XRD showed a broad peak at 25.9°, which correlates to an interlayer spacing of 0.344 nm on the (002) plane as calculated via Bragg's law. This spacing in close agreement with accepted values for h-BN. The broad peak may be due to the low number of atoms available for x-ray interaction for the foam material. The peak at 37.6° was credited to the aluminum sample holder as determined via an independent scan without the sample present, while the 43.8° peak was in close agreement with the (101) h-BN plane; however, with a diffraction signal near 44.5°, it is possible that could also be attributed to the sample holder. Moreover, peaks of 43.3, 74.4, 89.3 degrees corresponding to cubic BN (c-BN) (See, Aradi E, Naidoo S R, Billing D G, et al. (2014) "Ion beam modification of the structure and properties of hexagonal boron nitride: An infrared and X-ray diffraction study." *Nucl Instruments Methods Phys Res Sect B Beam Interact with*

*Mater Atoms* 331:1-4. doi: 10.1016/j.nimb.2014.01.031) and 41.6° and 53.0° for turbostratic BN (t-BN) (See, Kobayashi T, Tashiro S, Sekine T, Sato T (1997) "Phase Transformation of Turbostratic BN by Shock Compression." *Chem Mater* 9:2333-236. doi: 10.1021/cm960304d) were not in the diffraction pattern. Based on the EDS analysis, the samples conveyed a consistently high level of purity with approximately 99 wt. % boron and nitrogen present and only trace amounts of chlorine and aluminum detected. The small amount of chlorine observed is attributed to the HCl from the selective wet etching step used to remove the parent nickel foam, while the trace aluminum could have resulted from sample handling via aluminum tweezers or the supporting aluminum holder. Quantitative analysis of the EDS data for analysis of material stoichiometry indicated samples to be boron-rich. It is also difficult to be confident in the quantitative stoichiometry values obtained due to the known issue of light elements giving off low binding energies, as well as similarly like elements (188 eV for boron and 402 eV for nitrogen). This therefore makes it challenge to distinguish these elements from one another via an energy loss analysis for the purpose of obtaining an accurate determination of the B:N stoichiometric ratio.

Figure 9:
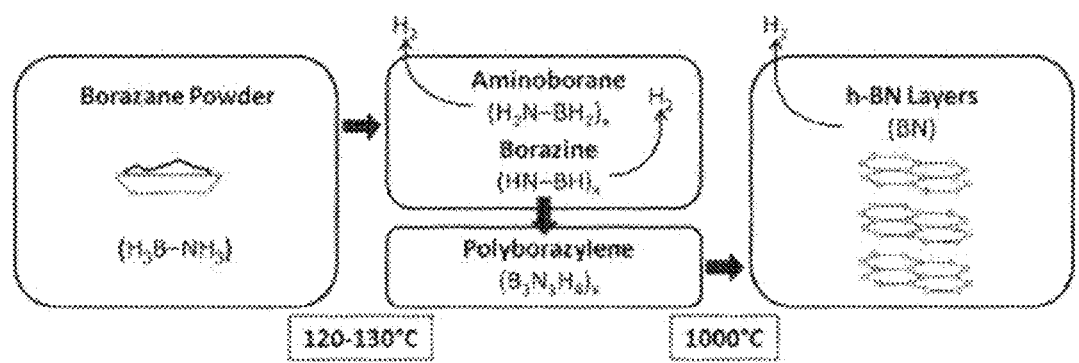
FIG. 9 is an illustration of possible multi-step process for formation of h-BN from borazane.

Borazane thermal decomposition between 100° C. and 130° C. has been shown to produce multiple boron-nitrogen-hydrogen chemical species, one of which is borazine. See, Frueh S, Kellett R, Mallery C, et al. (2011) "Pyrolytic decomposition of ammonia borane to boron nitride." *Inorg Chem* 50:783-792. doi: 10.1021/ic101020k. Heated borazine also produces polyborazylene as a byproduct (See, Frazen P J, Remsen E E, beck J S, et al. (1995) "Synthesis, Properties, and Ceramic Conversion Reactions of Polyborazylene. A High-Yield Polymeric Precursor to Boron Nitride." *Chem Mater* 7:1942-1956. doi: 10.1021/cm00058a028) which can then lead to a chain of reactions which results in the formation of h-BN. Thus, it is possible that the growth kinetics in this work follow a multi-step process (illustrated in FIG. 9) as follows: 1) borazane thermal decomposition into several boron-nitrogen-hydrogen species including aminoborane $(H_2H-BH_2)_x$ and borazine $((HN-BH)_x)$, 2) borazine conversion to polyborazylene $((B_3N_3H_4)_x)$, and finally 3) polyborazylene conversion to h-BN then deposited on the nickel surface.

The resulting material is structurally hierarchical in the sense that is possesses atomic (layer spacing), nanoscale (strut wall thickness), microscale (branch strut), and macroscale (overall sample size) dimension characteristics. Branch sizes of approximately 50 μm were noted, which is determined by the nickel foam because the deposition of h-BN layers is a bottom up process that occurs on the surfaces of the nickel substrate within its porosity. Cross-sectional FE-SEM images of a broken strut were used to measure strut wall thickness. The wall thickness fluctuated across individual struts, with the average thickness found to be 311±82 nm resulting from 50 individual measurements with a normal statistical distribution. These thickness values correspond to large atomic layer counts in the strut walls (approximately 1000), thus removing the ability to perform meaningful analysis by transmission electron microscopy (TEM).

Measuring the effective mass density was done by measuring the mass of the multiple samples using a precision mass balance (Sartorius Quintix) and the samples' macroscopic dimensions, measured via manufacturer specifications (thickness of parent foam) and dial calipers. The resulting effective density using this method was found to be 1.7±0.6 mg*cm$^{-3}$ for the growth conditions described in section 2.1.1. Using the effective density of the samples and the density for bulk h-BN (2.1 g/cm$^3$), the foam's volume fraction of solid h-BN can be approximated by the ratio of the two. The resulting volume fraction came to be approximately 0.08%, indicating a porosity of approximately 99.9% for the freestanding foam. The comparable effective density values observed are credited to this extremely high porosity. At such high void fractions, even major differences in strut wall thickness will only result in small changes of the effective density that, by a simple mass balance approach, may be difficult to measure. For comparison, this same method for finding porosity was also utilized on the stock nickel foam, which has solid struts, prior to any decomposition and a porosity of approximately 97.5% was calculated.

Thermal Conductivity of h-BN Foam/PMMA Composites.

Figure 10:
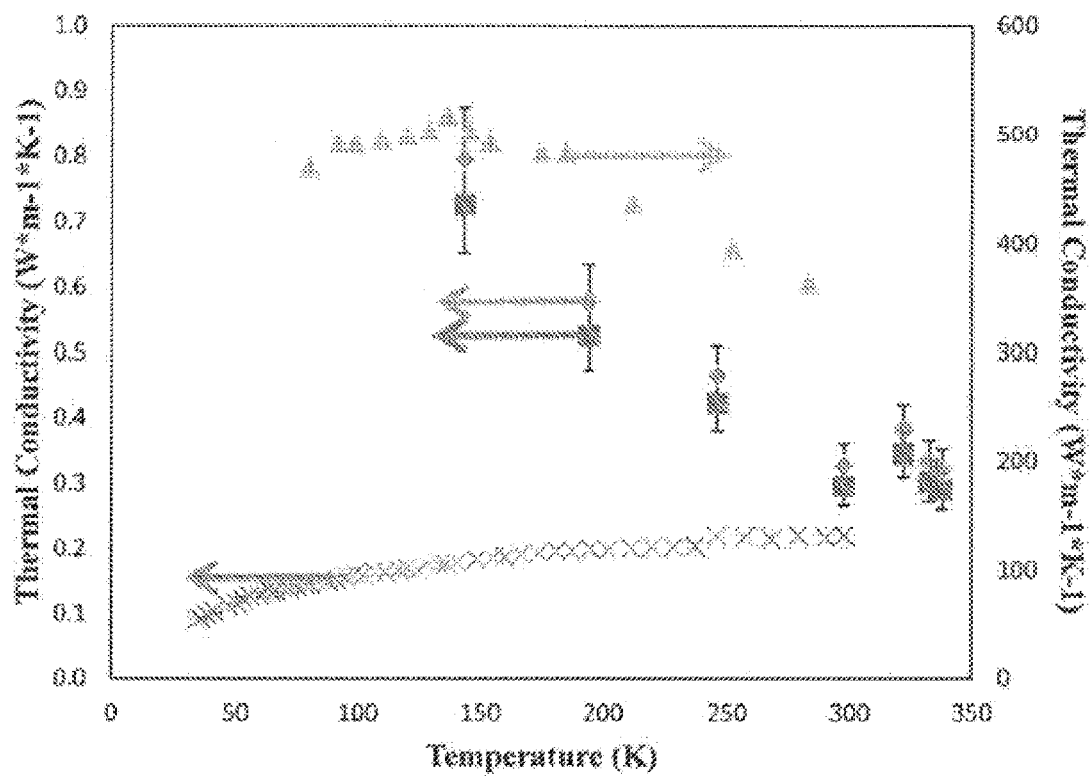
FIG. 10 is a plot of the thermal conductivity data for bulk h-BN (triangles), h-BN encapsulated with PMMA (diamonds), FEA corrected h-BN encapsulated with PMMA (squares), and bulk PMMA (Xs).

The first measurements taken were on an as-grown h-BN foam sample encapsulated in PMMA. This sample would serve as a baseline for comparing against post process annealed samples and as a baseline for comparison for other h-BN composite thermal results. For the first sample, the thermal conductivity results can be found plotted in FIG. 10. The h-BN foam/PMMA showed significant improvement in thermal conductivity, κ, as temperature decreased, matching a similar trend found in bulk h-BN which is the result of reduced phonon-phonon scattering that yields a peak κ of 517 W*m$^{-1}$*K$^{-1}$ around approximately 135K (Sichel E K, Miller R E, Abrahams M S, Buiocchi C J (1976("Heat Capacity and Thermal Conductivity of Hexagonal Pyrolytic Boron Nitride." *Phys Rev B* 13:4607-4611. doi: http://dx.doi.org/10.1103/PhysRevB.13.4607). Data was post processed via the aforementioned heat transfer analysis, yielding a maximum value of 0.8±0.08 W*m$^{-1}$*K$^{-1}$ at a sample temperature of 143K. Bulk PMMA is also plotted (See, Cahill D G, Pohl R O (1987) "Thermal conductivity of amorphous solids above the plateau." *Phys Rev B* 35:4067-4073) and shows a slightly decreasing trend as temperature decreases, indicating an even larger thermal conductivity improvement via the h-BN foam at the lower temperatures.

Figure 11:
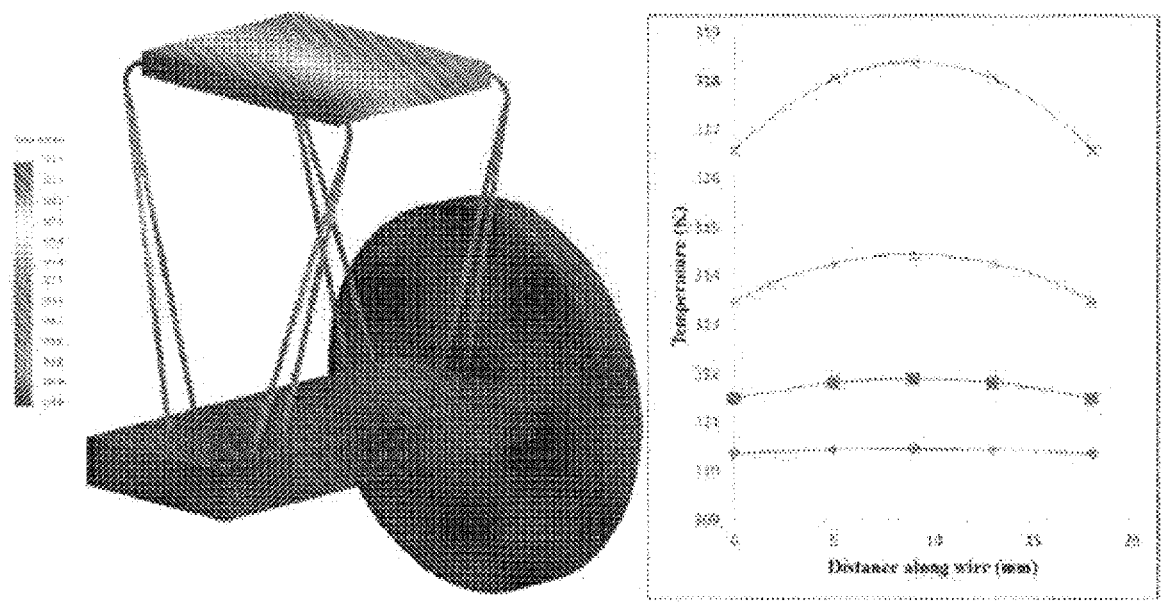
FIG. 11 depicts the FEA results for the sensing wire temperature profiles for current steps of 0.25, 0.50, 0.75, and 1.0 A for Sample 1, a h-BN/PMMA composite, at 310K.

Through FEA, it was found that the parabolicity along with the heating and sensing four-probe regions of the PRTs was not insignificant compared to experimental uncertainty, therefore requiring FEA correction of the raw data rather than entirely relying on the analytical solution described above. This data is also found in FIG. 10, and resulted in 10.3% less than what was measured on average, although it was noted that a small correction occurred at lower temperatures (9.75% at 140K as opposed to 10.7% at 310K). In order for the FEA to be accurate, the model was designed exactly to the dimensions of the stage, PRTs, and sample size as possible. Next, the same heat inputs were used as per each temperature set point's values and scaled to the model's PRT dimensions. Then, PRT resistances were adjusted to match experimental resistances and then, finally, sample thermal conductivity was altered until its resistance matched experimental results. The final thermal conductivity input was then determined to be the corrected value. A look at an example FEA result can be found in FIG. 11, which shows the overall temperature profile of the system during a measurement, as well as the temperature profile along the sensing region of the sample for Sample 1 at 310K. The temperature profile shown represents a Q input that corresponds to a 1 A experimental current step. Still referring to FIG. 11, it can be seen that a difference of approximately 2K exists from end to center on the sensing wire, yielding error in the analytical analysis as described above.

As-Grown Sample Data Analysis.

Figure 12:
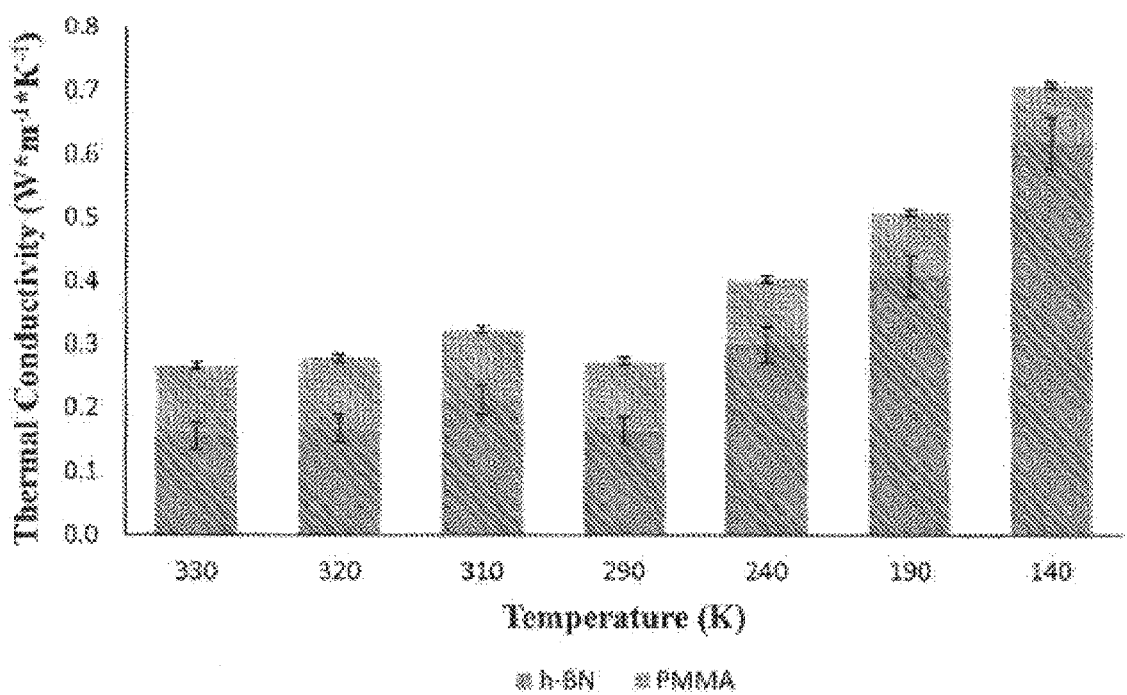
FIG. 12 is a graph of the rule of mixture results of PMMA and h-BN foam thermal contributions.

In order to fully understand the effects of incorporating the h-BN foam into the neat PMMA, the contributions of the continuous h-BN foam and the PMMA, respectfully, were analyzed to determine the thermal conductivity, κ, of the h-BN foam itself. A rule of mixtures approach is sufficient using $\kappa_{foam} = \kappa_{composite} - \Phi_{matrix} * \kappa_{matrix}$ to determine a contribution of each material, due to the continuous foam structure of the h-BN filler. For this calculation $\kappa_{foam}$ represents the contribution to the full thermal conductivity by the h-BN foam filler. $\kappa_{composite}$ is the thermal conductivity measured in the experiment, $\kappa_{matrix}$ is the thermal conductivity of the polymer matrix and $\Phi_{matrix}$ represents the polymer's volumetric contribution of the full composite. As shown in FIG. 12, the h-BN foam dominates the contribution of the overall thermal transport of the composite, showing a 54-85% contribution throughout the temperature range. This is despite its very small volumetric loading (approximately 0.08%), which was calculated by the ratio of the foam's density to the composite's density. The foam's density was calculated by using the previously noted h-BN foam density to estimate the mass of the foam based on its dimensions within the composite and dividing by the overall composite's volume (the composite would be thicker than foam due to additional PMMA from composite production). The first sample resulted in the most void space during the PMMA encasement, yielding a $\Phi_{PMMA}=50.0\pm1.2$ vol % and a $\Phi_{foam}=0.076\pm0.012$ vol %. Using the ratio of foam density found via precise mass balance readings and caliper measurement to bulk nickel density, it was found that the nickel foam had a porosity of 97.4%, resulting in 2.6±0.09 vol % of the volume attributed to the hollow h-BN struts. This space is open void space under high vacuum, resulting in no contribution to the heat transfer in the experiment. The rest of the internal void space is air, which gives a small contribution to the overall thermal conductivity and was accounted for in analysis by deducting the contribution of the air form the composite result via its thermal conductivity at the specified temperature and its volumetric contribution. The second sample, the first annealed sample, came out with less void space than the as-grown sample with $\Phi_{PMMA}=60.1\pm3.1$ vol % and $\beta_{foam}=0.070\pm0.011$ vol %, with 2.6% void from the hollow struts, and the rest void-trapped air pockets. The third sample showed a comparable volume distribution with $\Phi_{PMMA}=54.4\pm2.4$ vol % and $\Phi_{foam}=0.071\pm0.010$ with 2.6% void and the rest air.

Using this information, the Lemlich model was used for estimating bulk thermal conductivity from low density foams represented by $$\kappa_{bulk} = \frac{3}{\Phi} * k_{foam}.$$

Using this equation and the effective foam thermal conductivity via the rule of mixtures calculation, the thermal conductivity of the sample's representative bulk, or inherent, value along its strut can be estimated. This is plotted below in FIG. 13, along with represented bulk in-plane h-BN values from Sichel et al.

Figure 13:
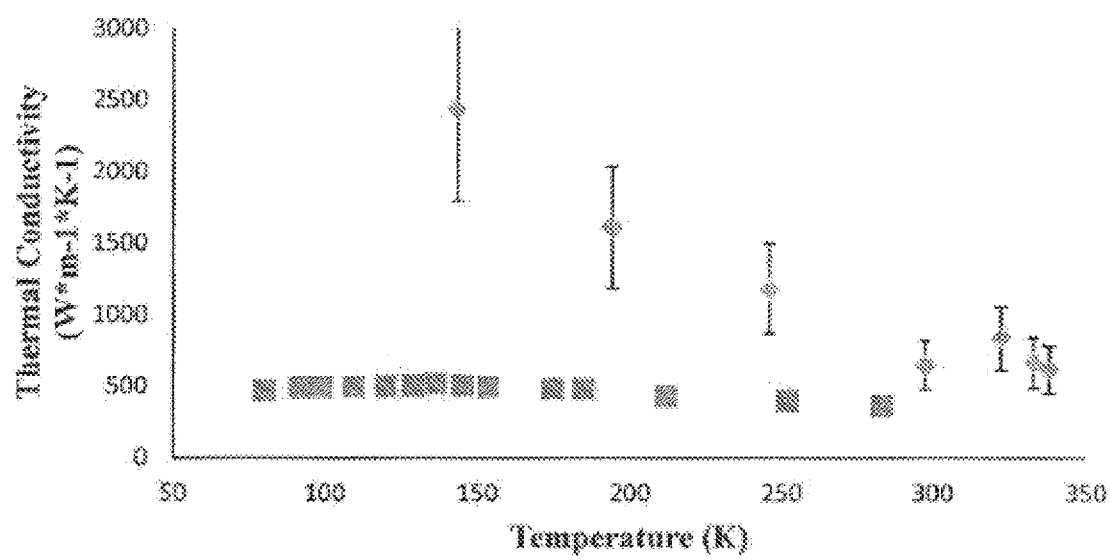
FIG. 13 is a graph of the thermal conductivity data for bulk h-BN (squares) compared to the estimated bulk values along the struts of the h-BN foam (diamonds).

Still referring to FIG. 13, the initial results of thermal conductivity at room temperature and above room temperature are within reason of the tabulated bulk h-BN results; however, the thermal conductivity quickly escalates away when the temperature decreases, indicating a possible disconnect of the extremely low density foam theory at low temperature. Moreover, a bulk value of 648 $W*m^{-1}K^{-1}$ is reported here at 297.5K, which is much closer to literature than previously reported for room temperature h-BN via this modeling method.

Thermal Conductivity Analysis for Annealed Samples.

Figure 14:
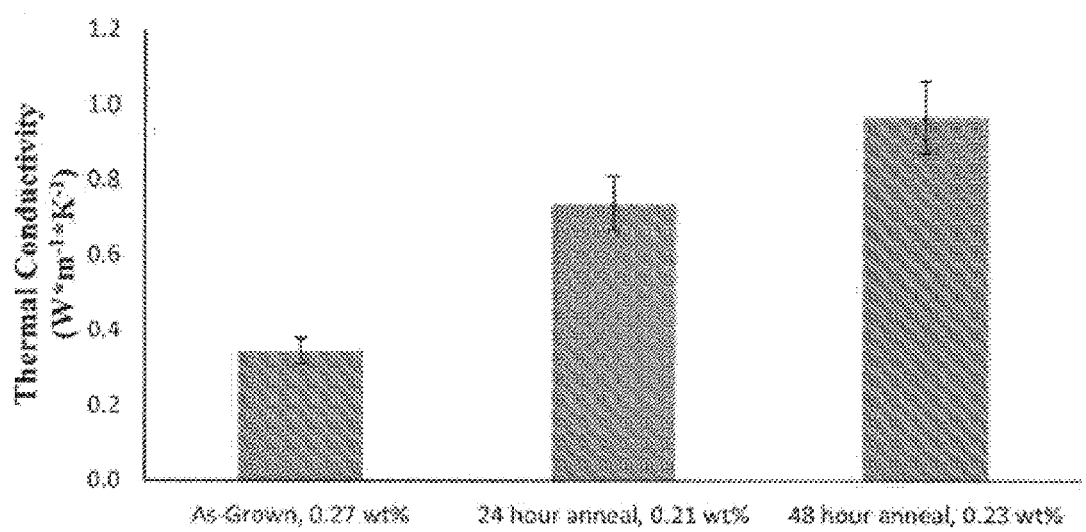
FIG. 14 is a graph of the thermal conductivity comparison data for the as-grown h-BN/PMMA, 24 hour annealed h-BN/PMMA, and 48 hour annealed H—BN/PMMA samples.

The samples were post process annealed in air, and were therefore limited by an upper limit for temperature, since h-BN thermally decomposes in air from 800-1000° C. Therefore, an annealing temperature of 700° C. was used, and the time was extended much longer than typical annealing processes in inert atmospheres. FIG. 14 shows the results for the annealed samples versus the as-grown samples.

Referring to FIG. 14, large improvements on the h-BN/PMMA was seen with a post process h-BN anneal. Since the weight fractions on each sample were comparable, the improvement is solely attributable to the annealing process, and more specifically, the annealing time, as significant improvement on the 24-hour anneal was seen with a 48 hour anneal. It is possible that the extended annealing time above the temperature necessary for h-BN growth mimics a short, high temperature anneal by allowing time for additional crystallization and grain growth as well as improving any non-uniform growth area within the foam. This would lead to much better results than a sample with no post treatment and improvement upon a sample with a shorter heat treatment. It is suspected that additional time with this annealing process would soon be negligible, owing to the 31% improvement from Sample 2 (24-hour anneal, 0.21 wt %) to Sample 3 (48-hour anneal, 0.23 wt %), opposed to the 114% improvement seen from Sample 1 (as-grown, 0.27 wt %) to Sample 2.

In conclusion, the experiments show that high specific κ, structurally hierarchal h-BN nanomaterials were created via the APCVD process. The three-dimensional foam structure had an effective density of 1.7±0.6 $mg*cm^{-3}$. The experiments further showed that the freestanding h-BN structure (without insulating material encapsulation) had strut wall thickness of 311±82 nm obtained for the stated growth conditions, which is a thickness that is an order of magnitude greater than anything reported thus far. Samples' thermal conductivity was then tested experimentally over a wide temperature range of 140-330 K using a steady-state, 1D conduction method previously used only for micro, not macro scale samples. Post FEA adjustment, room temperature thermal conductivity of the as-grown h-BN/PMMA composite was 0.34±0.034 $W*m^{-1}K^{-1}$, while a maximum κ of 0.73±0.073 $W*m^{-1}K^{-1}$ was seen at low temperature, yielding a 557% thermal enhancement on the PMMA polymer matrix at 143K. Further, post-process annealing was conducted and subsequently tested against as-grown results. With a 48 hour, 700° C. post-growth anneal, an improvement of 181% on the as-grown sample's thermal conductivity was seen, nearly a 3 fold improvement over the non-annealed sample, reaching 0.97±0.097 $W*m^{-1}K^{-1}$ at a h-BN weight fraction of approximately 0.23%.

The invention claimed is:

1. A thermally conductive, electrically insulating composite material comprising:
   (a) an open-porous hexagonal boron nitride containing structure including an open-porous catalyst metal foam with hexagonal boron nitride deposited in a contiguous, interface-free manner thereon having a pore size of greater than 100 microns to about 1000 microns, wherein the hexagonal boron nitride forms a layer at least 50 nm thick on the catalyst foam; and
   (b) an electrically insulating material encapsulating the hexagonal boron nitride containing structure and filling at least 50% of the pore space of the hexagonal boron nitride containing structure, wherein the insulating material is at least one from the group consisting of a thermoset material, a silicone, an epoxy, a polyurethane, a wax, and a sol-gel ceramic; and (c) the overall thermal conductivity of the composite material being at least 1 $W*m^{-1}K^{-1}$.

2. The thermally conductive, electrically insulating composite material of claim 1, wherein the hexagonal boron nitride layer consists essentially of hexagonal boron nitride.

3. The thermally conductive, electrically insulating composite material of claim 2, wherein the hexagonal boron nitride has less than 1% impurities.

4. The conductive, electrically insulating composite material of claim 1, wherein the electrically insulating material fills at least 90% of the pores in the hexagonal boron nitride containing structure.

5. The thermally conductive, electrically insulating composite material of claim 1, wherein the layer of hexagonal boron nitride is at least 100 nm thick on the catalyst metal foam.

6. The thermally conductive, electrically insulating composite material of claim 1, wherein the porous hexagonal boron nitride containing structure is formed from a method comprising the steps of:

(a) providing a catalyst foam material;
(b) flowing a boron and nitrogen containing gas across the catalyst foam material at near atmospheric pressure while maintaining a temperature of at least 900° C.;
(c) continuing step (b) until a layer of hexagonal boron nitride at least 50 nm thick is deposited on the catalyst foam material; and
(d) etching away a majority of the catalyst material to leave the porous boron nitride containing structure.

7. The thermally conductive, electrically insulating composite material of claim 6, further comprising the step of annealing the catalyst foam to remove oxides prior to the boron nitride deposition step.

8. The thermally conductive, electrically insulating composite material of claim 6, wherein step (a) further includes positioning a catalyst foam material in a furnace, and step (b) further includes maintaining a furnace temperature of at least 900° C.

9. The thermally conductive, electrically insulating composite material of claim 6, wherein the hexagonal boron nitride layer consists essentially of hexagonal boron nitride.

10. The thermally conductive, electrically insulating composite material of claim 1, wherein the catalyst foam is formed of an alloy which is at least 90% by weight of a metal from the group consisting of copper, nickel, and platinum.

11. The thermally conductive, electrically insulating composite material of claim 6, wherein (i) the near atmospheric pressure is between about 80 and 120 kPa, and (ii) the furnace temperature does not exceed about 1200° C.

12. The thermally conductive, electrically insulating composite material of claim 6, wherein the boron and nitrogen containing gas has a ratio by weight of boron to nitrogen of between about 0.75:1 to about 1.25:1.

13. The thermally conductive, electrically insulating composite material of claim 6, wherein the boron and nitrogen containing gas is generated by sublimating a boron and nitrogen containing powder in a gas flow which is directed over the catalyst metal foam.

14. The thermally conductive, electrically insulating composite material of claim 1, wherein the catalyst foam is formed of one metal from the group of copper, nickel, or platinum.

* * * * *